US006943059B2

(12) United States Patent
Maeda

(10) Patent No.: US 6,943,059 B2
(45) Date of Patent: Sep. 13, 2005

(54) FLIP CHIP MOUNTING METHOD OF FORMING A SOLDER BUMP ON A CHIP PAD THAT IS EXPOSED THROUGH AN OPENING FORMED IN A POLYIMIDE FILM THAT INCLUDES UTILIZING UNDERFILL TO BOND THE CHIP TO A SUBSTRATE

(75) Inventor: Hiroshi Maeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 32 days.

(21) Appl. No.: 10/687,085

(22) Filed: Oct. 17, 2003

(65) Prior Publication Data

US 2004/0235220 A1 Nov. 25, 2004

(30) Foreign Application Priority Data

May 22, 2003 (JP) .......................................... 2003-144390

(51) Int. Cl.[7] .............................................. H01L 21/58
(52) U.S. Cl. ....................... 438/108; 438/118; 438/601; 438/613
(58) Field of Search ............................... 438/108, 118, 438/126, 127, 132, 601, 612, 613, 958

(56) References Cited

U.S. PATENT DOCUMENTS

| 6,028,011 | A | * | 2/2000 | Takase et al. ................ 438/745 |
| 6,707,162 | B1 | * | 3/2004 | Ho et al. ...................... 257/778 |
| 2003/0096494 | A1 | * | 5/2003 | Sakuyama et al. .......... 438/613 |

FOREIGN PATENT DOCUMENTS

| JP | 2000-357743 | 12/2000 |
| JP | 2002-203866 | 7/2002 |

* cited by examiner

Primary Examiner—Stephen W. Smoot
(74) Attorney, Agent, or Firm—Oblon, Spivak, McClelland, Maier & Neustadt, P.C.

(57) ABSTRACT

A semiconductor chip (15) having a pad (5) covered with a passivation film (7) is prepared, and the passivation film (7) over the pad (5) is selectively removed to expose the pad (5). Next, a polyimide film (11) having an opening (12) for exposing the pad (5) is formed on the passivation film (7). Thereafter, solder bumps (14) are formed on the pad (5), and an underfill resin (17) is filled between an assembly substrate (16) and the semiconductor chip (15) to bond the assembly substrate (16) and semiconductor chip (15) with the solder bumps (14) interposed therebetween.

4 Claims, 12 Drawing Sheets

FLIP CHIP MOUNTING METHOD OF FORMING A SOLDER BUMP ON A CHIP PAD THAT IS EXPOSED THROUGH AN OPENING FORMED IN A POLYIMIDE FILM THAT INCLUDES UTILIZING UNDERFILL TO BOND THE CHIP TO A SUBSTRATE

BACKGROUND OF THE INVENTION

1. Field of the Invention

The present invention relates to a flip chip mounting method, and more particularly to a method of manufacturing a flip chip prior to being mounted.

2. Description of the Background Art

With a flip chip mounting method for bonding a semiconductor chip and an assembly substrate with solder bumps interposed therebetween, stress concentrates on the solder bumps with thermal change and impact occurring after bonding, causing the solder bumps to be stripped from the semiconductor chip or assembly substrate.

Thus, a method has been employed by which an underfill resin is filled between a semiconductor chip and an assembly substrate in order to ease concentration of stress on solder bumps and to promote adhesion between the semiconductor chip and assembly substrate (e.g., Japanese Patent Application Laid-Open No. 2002-203866; FIG. 1).

For flip chip mounting, a pad covered with a passivation film needs to be exposed from the passivation film in order to form solder bumps on the side of a semiconductor chip.

As a method of exposing a pad, a method has been employed by which a polyimide film having an opening above the pad is formed on a passivation film, and an etching process is carried out using the polyimide film as a mask to form an opening in the passivation film so as to reach the pad, thereby exposing the pad from the bottom of the opening.

With this method, however, a reaction product generated in the etching process carried out on the passivation film adheres to the surface of the polyimide film, causing a cured layer to be formed on the polyimide film.

In the case where the semiconductor chip and assembly substrate are bonded by flip chip mounting using an underfill resin with the cured layer formed on the polyimide film, adhesion between the underfill resin and cured layer is poor, which problematically causes the assembly substrate and semiconductor chip to be stripped from each other during device operation.

Poor adhesion between the assembly substrate and semiconductor chip had not been in question with semiconductor chips having smaller area, but has become perceived as a problem with a recent trend toward larger area of semiconductor chips. This is because stresses have become increased with increase in area of semiconductor chips to such a degree that frequent splitting of the assembly substrate and semiconductor chip from each other due to poor adhesion therebetween cannot be neglected.

SUMMARY OF THE INVENTION

An object of the present invention is to provide a flip chip mounting method by which a semiconductor chip and an assembly substrate are not readily stripped from each other in the case where the semiconductor chip and assembly substrate are bonded by a flip chip method using an underfill resin.

According to the present invention, the flip chip mounting method includes the following steps (a) through (e). The step (a) is to prepare a chip including a pad covered with an insulation film. The step (b) is to selectively remove the insulation film over the pad to expose the pad. The step (c), after the step (b), is to form a polyimide film including a first opening for exposing the pad, on the insulation film. The step (d) is to fill the first opening to form a solder bump on the pad. The step (e) is to fill an underfill resin between an assembly substrate and the chip, for bonding the assembly substrate and the chip with the solder bump interposed therebetween.

When removing the insulation film, a reaction product of the insulation film does not adhere to the surface of the polyimide film. Therefore, reduction in adhesion of the semiconductor chip and assembly substrate to the underfill resin due to the reaction product can be prevented, allowing adhesion between the chip and assembly substrate to be promoted.

These and other objects, features, aspects and advantages of the present invention will become more apparent from the following detailed description of the present invention when taken in conjunction with the accompanying drawings.

DESCRIPTION OF THE PREFERRED EMBODIMENTS

The present invention is characterized by a method of removing a passivation film covering the upper surface of a pad using a resist as a mask rather than using a polyimide film as a mask, then forming a polyimide film, forming a solder bump on the pad, and bonding a semiconductor chip and an assembly substrate by a flip chip method using an underfill resin.

The present invention will specifically be described referring to the accompanying drawings showing preferred embodiments of the invention.

First Preferred Embodiment

A first preferred embodiment is directed to the case of using a single-layer passivation film. A flip chip mounting method according to the present embodiment will specifically be described referring to sectional views showing manufacturing steps.

Figure 1:
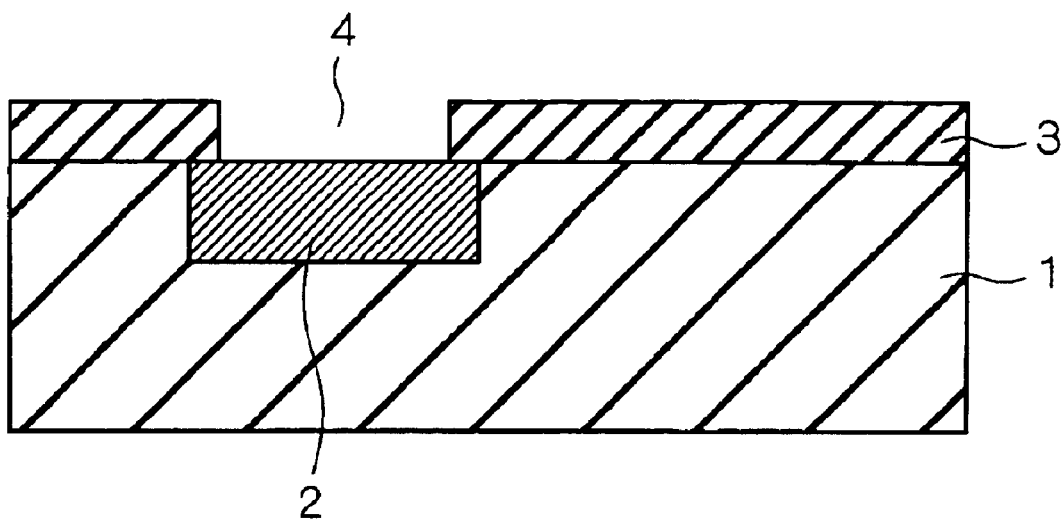
FIGS. 1 through 6 are explanatory sectional views of manufacturing steps of a chip according to a first preferred embodiment of the present invention.

FIG. 1 illustrates part of the surface of a semiconductor chip before or after being separated from a wafer. As shown, a copper interconnect line 2 is provided in the surface of an interlayer insulation film 1, and an insulation film 3 is formed to cover the interlayer insulation film 1 and copper interconnect line 2. Next, part of the insulation film 3 covering the copper interconnect line 2 is removed to form a recess 4 in the surface of the insulation film 3, so that the copper interconnect line 2 is exposed from the bottom of the recess 4.

Figure 2:
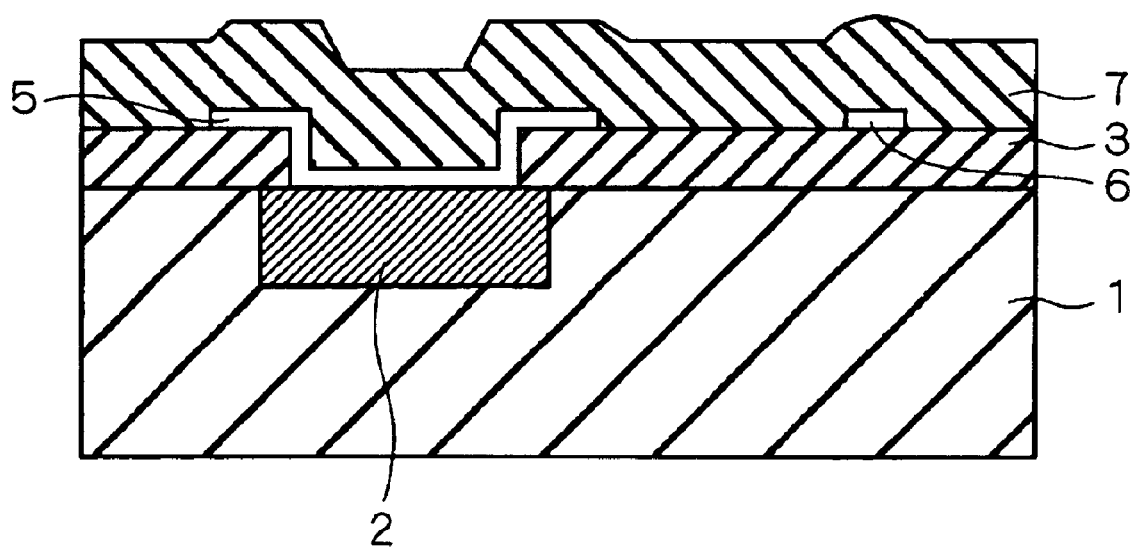

Next, as shown in FIG. 2, a pad 5 made of aluminum or the like is formed to cover the bottom and side surfaces of the recess 4 and part of the upper surface of the insulation film 3 near the recess 4, and a fuse 6 made of aluminum or the like is further formed on the surface of the insulation film 3 separately from the pad 5. Thereafter, a passivation film 7 (a kind of insulation film) is formed by CVD method or the like to cover the insulation film 3, pad 5 and fuse 6. Here, the passivation film 7 is, e.g., a silicon oxide film or the like, having such a thickness that allows blowing of the fuse 6.

Figure 3:
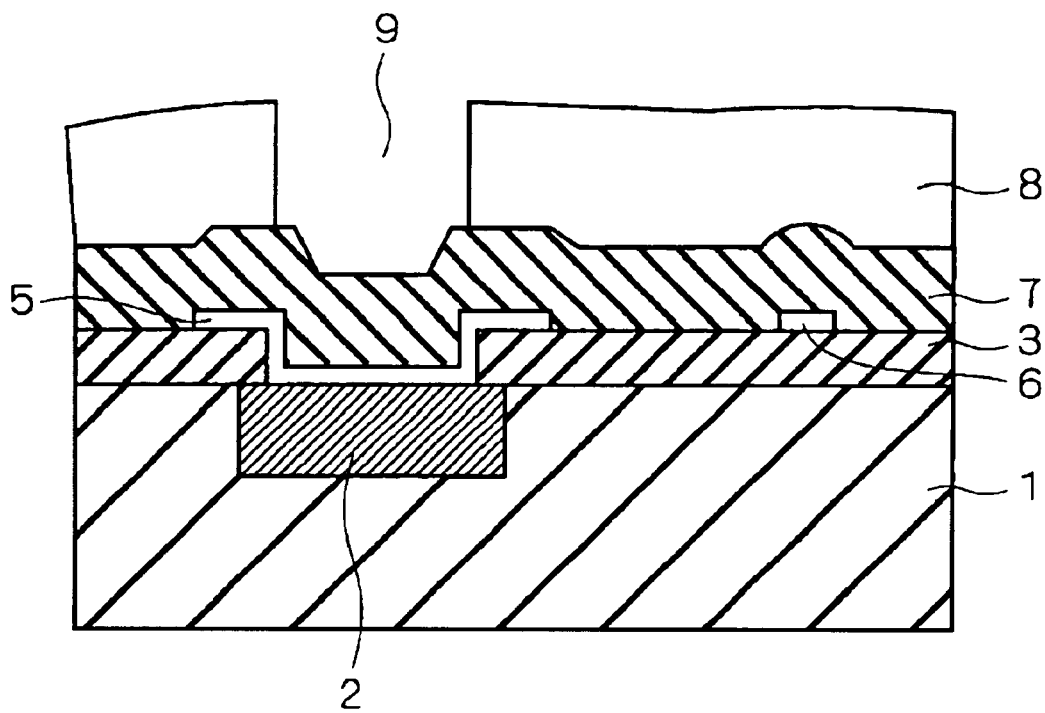

Next, as shown in FIG. 3, a resist 8 is coated to cover the passivation film 7, and exposure and development is performed to form an opening 9 in the surface of the resist 8 above the pad 5. The passivation film 7 is exposed from the bottom surface of the opening 9.

Figure 4:
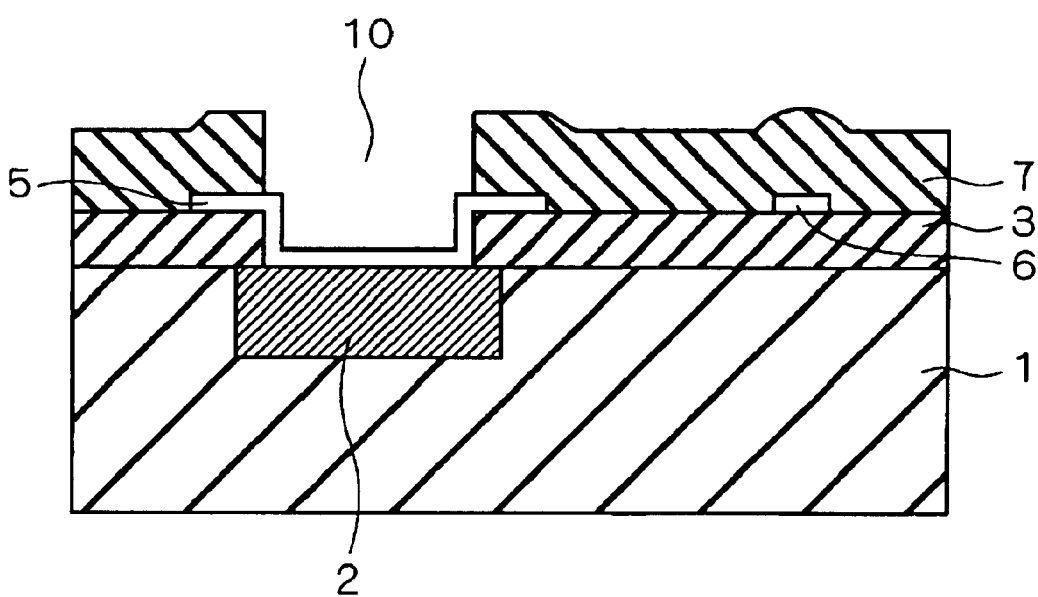

Next, anisotropic etching is performed using the resist 8 as a mask to selectively remove the passivation film 7, for forming an opening 10. Thereafter, the resist 8 is removed as shown in FIG. 4. As is seen from FIG. 4, the pad 5 is exposed from the bottom surface of the opening 10 with this step.

Next, a photosensitive polyimide film 11 is coated to cover the pad 5 and passivation film 7, and exposure and development is performed using a mask (not shown) having openings above the pad 5 and fuse 6, respectively, for forming openings 12 and 13 in the surface of the polyimide film 11. The mask is thereafter removed, and the polyimide film 11 is subjected to curing to obtain the structure shown in FIG. 5. As is seen from FIG. 5, the passivation film 7 and polyimide film 11 are absent above the pad 5 (where the opening 12 is provided) and only the passivation film 7 is formed over the fuse 6 (where the opening 13 is provided).

Figure 6:
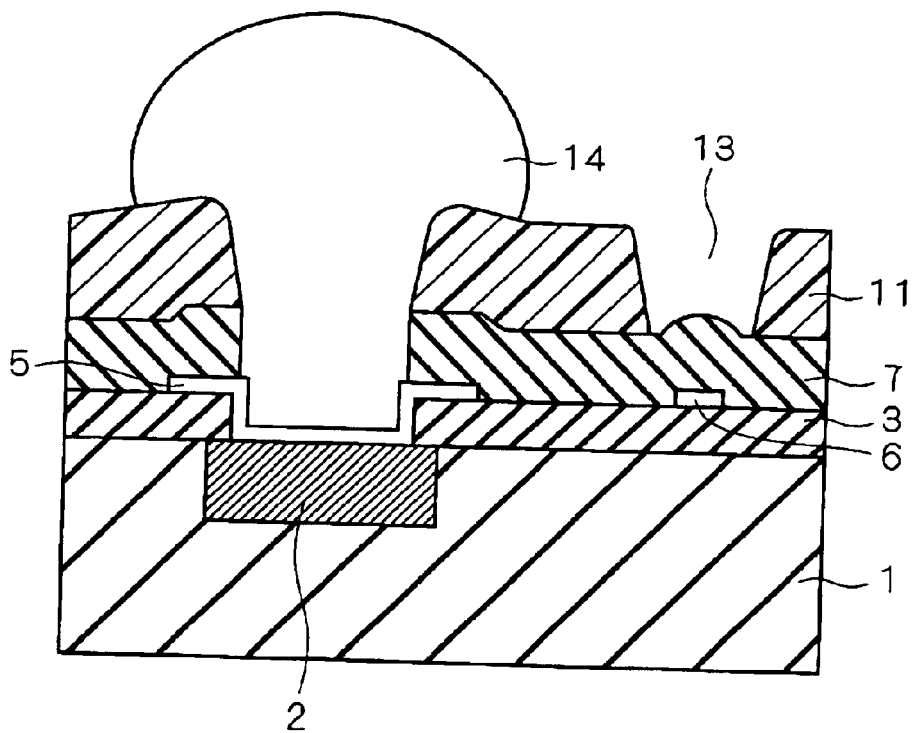
Figure 7:
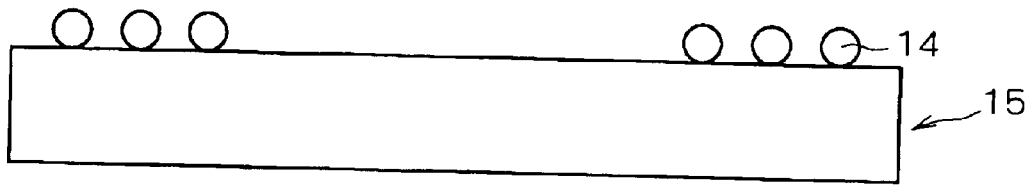
FIG. 7 is a sectional view illustrating a semiconductor chip as a whole.

Next, a solder bump 14 is formed on the pad 5 to fill the opening 12 using a plating method which has conventionally been employed. FIG. 6 shows the solder bump 14 as formed. FIG. 7 is a general view of a semiconductor chip 15 with solder bumps 14 formed thereon.

Figure 8:
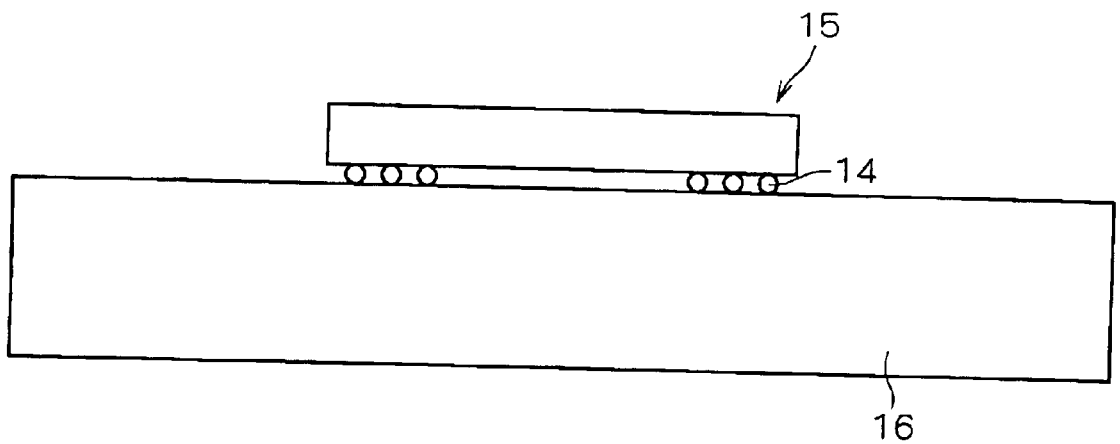
FIGS. 8 and 9 are sectional views illustrating a flip chip mounting method.

Next, the semiconductor chip 15 is disposed such that the surface on which the solder bums 14 are formed faces a mounting surface of an assembly substrate 16 and is bonded to the mounting surface of the assembly substrate 16 by the flip-chip method. The way of bonding is shown in FIG. 8.

Figure 9:
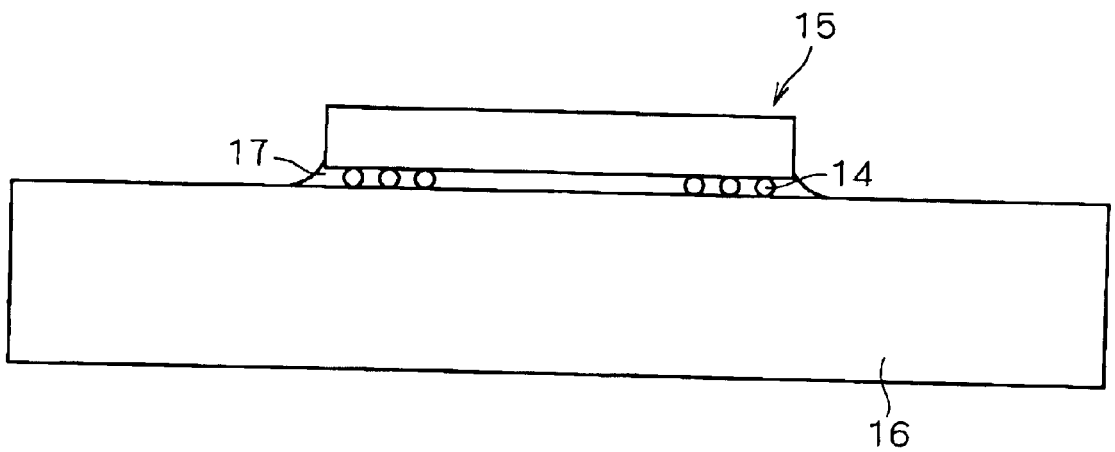

Finally, as shown in FIG. 9, an underfill resin 17 is poured (filled) between the semiconductor chip 15 and assembly substrate 16.

The underfill resin 17 functions as adhesive as well as stress relieving material. Thus, the underfill resin 17 can promote adhesion between the semiconductor chip 15 and assembly substrate 16 connected with the solder bumps 14 interposed therebetween and relieve concentration of stress on the solder bumps 14 occurring during device operation.

Among methods of filling the underfill resin 17 are a method of pouring the underfill resin 17 into the gap between the semiconductor chip 15 and assembly substrate 16 and a method of previously coating the underfill resin 17 on the mounting surface of the assembly substrate 16.

By the flip chip mounting method of the present embodiment as described above, part of the passivation film 7 over the pad 5 is removed before forming the polyimide film 11, which prevents a reaction product generated in removing the part of the passivation film 7 from adhering to the surface of the polyimide film 11.

Therefore, as described in the background art, it is possible to prevent reduction in adhesion of the semiconductor chip 15 and assembly substrate 16 to the underfill resin 17 due to a reaction product, which can promote adhesion between the semiconductor chip 15 and assembly substrate 16.

Although described as having such a thickness that allows blowing of the fuse 6, the passivation film 7 may have a greater thickness.

Figure 5:
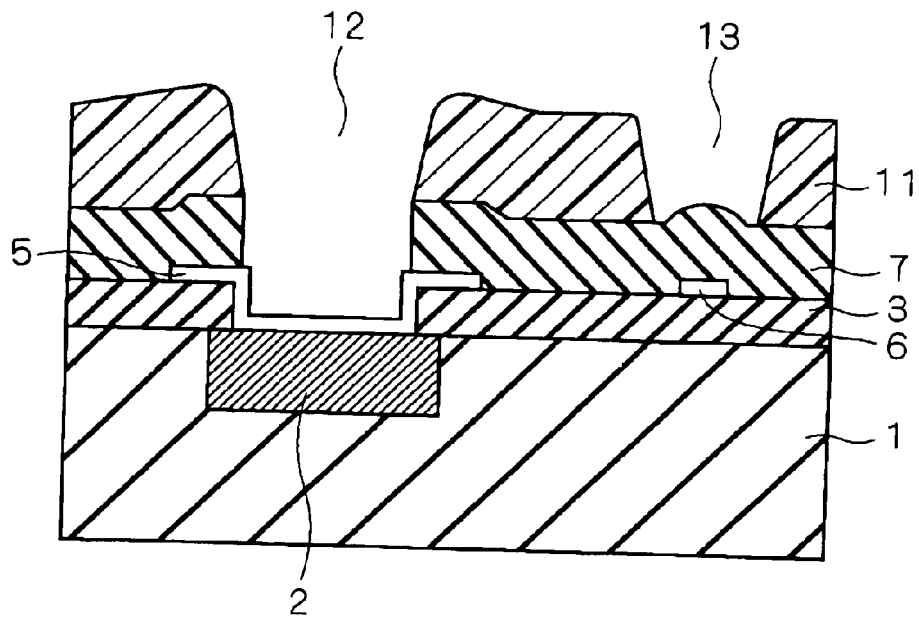
Figure 10:
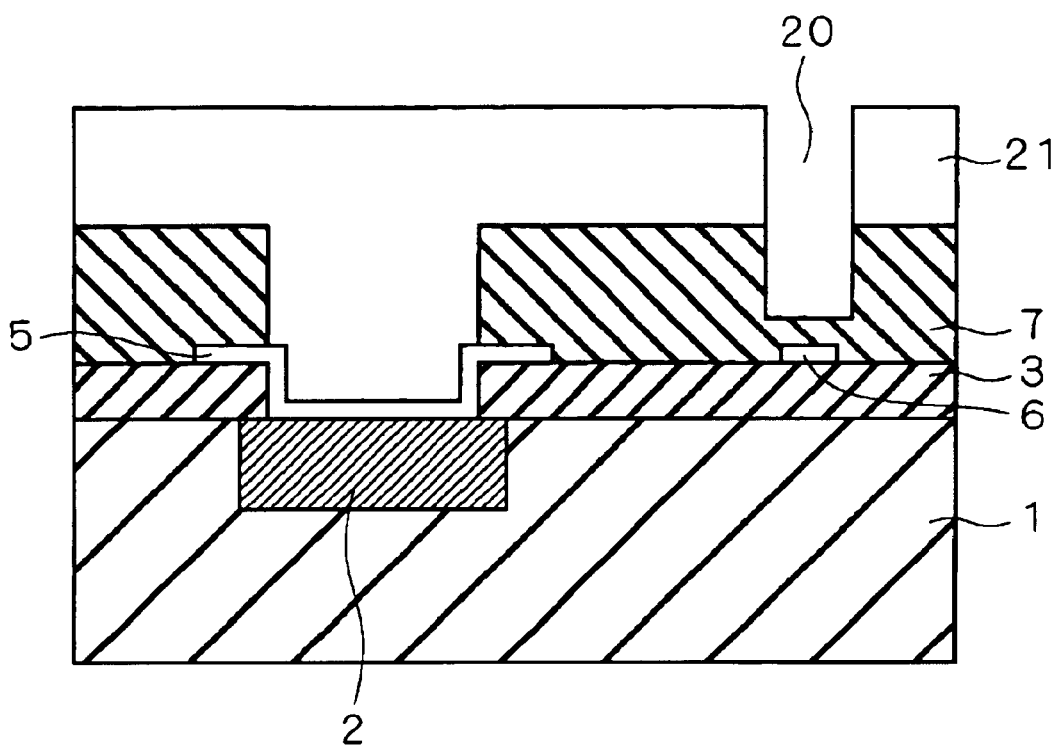
FIG. 10 is a sectional view illustrating manufacturing steps of the chip according to the first preferred embodiment.

In this case, as shown in FIG. 10, a resist 21 having an opening 20 is provided above the fuse 6 after the step shown in FIG. 4, and the passivation film 7 is etched to have such a thickness that allows blowing of the fuse 6 using the resist 21 as a mask, and the step shown in FIG. 5 is thereafter performed.

Figure 11:
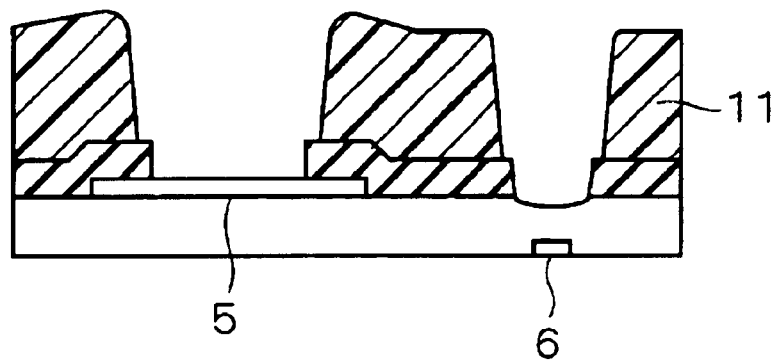
FIG. 11 is a sectional view illustrating the structure of a chip according to a variant of the first preferred embodiment.

As described, provided that the step of etching the passivation film 7 to have such a thickness that allows blowing of the fuse 6, the pad 5 and fuse 6 are not required to be provided in the same layer, but the fuse 6 may be provided in a layer below the one in which the pad 5 is formed as shown in FIG. 11.

Although described as being a single layer in the above description, the insulation film 3 may be a two-layered film in which a silicon nitride film and a silicon oxide film are stacked in this order. Such silicon nitride film is provided as moisture barrier for layers under the silicon nitride film.

Second Preferred Embodiment

A second preferred embodiment is directed to the case of using a two-layered passivation film (in which a nitride film and an oxide film are stacked). A flip chip mounting method according to the present embodiment will specifically be described referring to sectional views showing manufacturing steps. The steps are the same as those in the first preferred embodiment as far as the structure shown in FIG. 2 is obtained, repeated explanation of which is thus omitted here. In the present embodiment, the first layer of the passivation film is a silicon oxide film 7a.

Figure 12:
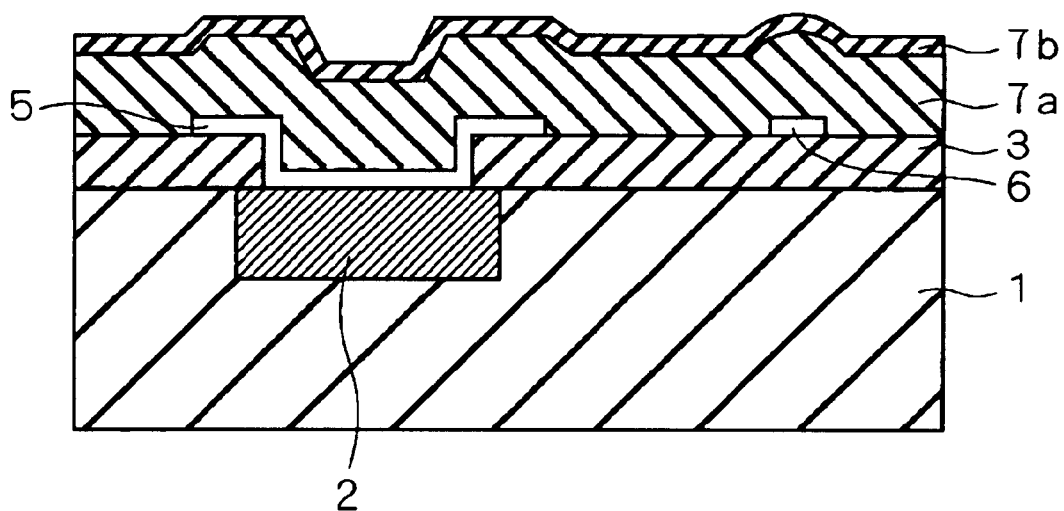
FIGS. 12 through 17 are explanatory sectional views of manufacturing steps of a chip according to a second preferred embodiment of the invention.

Next, as shown in FIG. 12, a silicon nitride film 7b is formed as the second layer of the passivation film by the CVD method or the like to cover the silicon oxide film 7a. Here, the silicon nitride film 7b functions as moisture barrier for the copper interconnect line 2 and the like.

Figure 13:
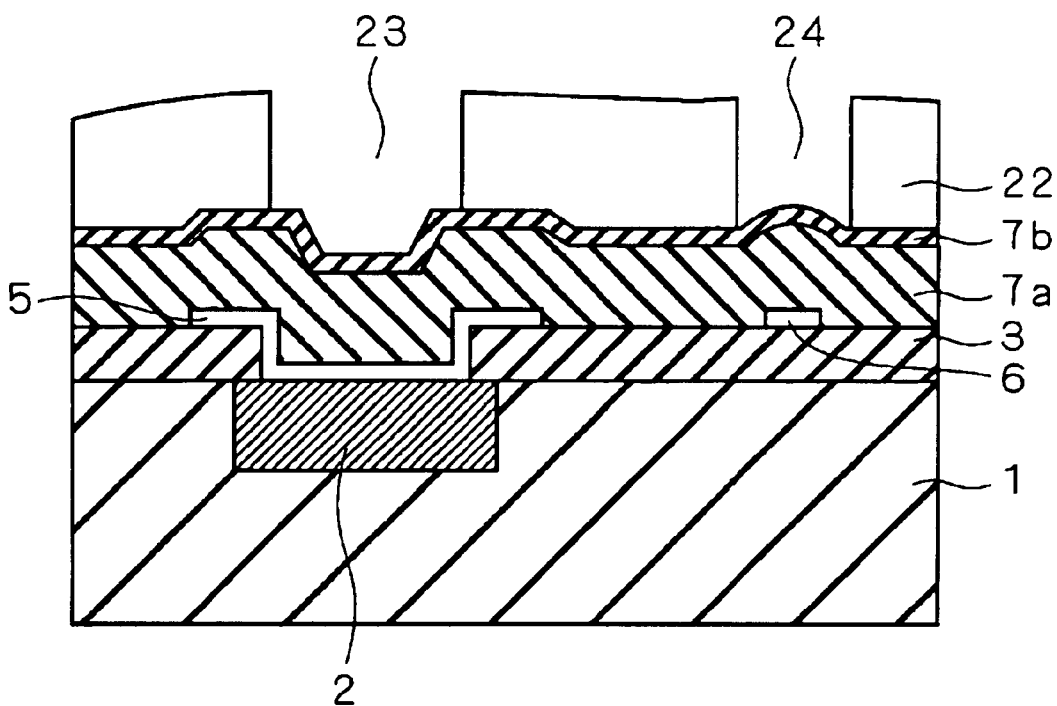

Next, as shown in FIG. 13, a resist 22 is coated to cover the silicon nitride film 7b, and exposure and development is performed to form openings 23 and 24 in the surface of the resist 22 above the pad 5 and fuse 6. The opening 23 is present above the pad 5 and the opening 24 is present above the fuse 6. The silicon nitride film 7b is exposed from the bottom surfaces of the openings 23 and 24.

Figure 14:
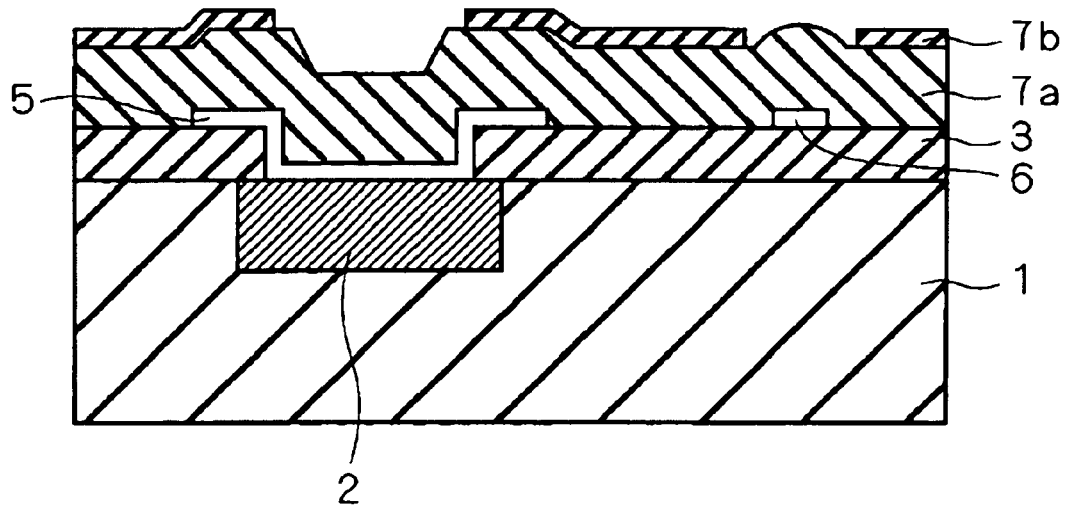

Next, anisotropic etching is performed using the resist 22 as a mask to selectively remove the silicon nitride film 7b. Thereafter, the resist 22 is removed as shown in FIG. 14. As is seen from FIG. 14, part of the silicon nitride film 7b above the pad 5 and fuse 6 has been removed.

Figure 15:
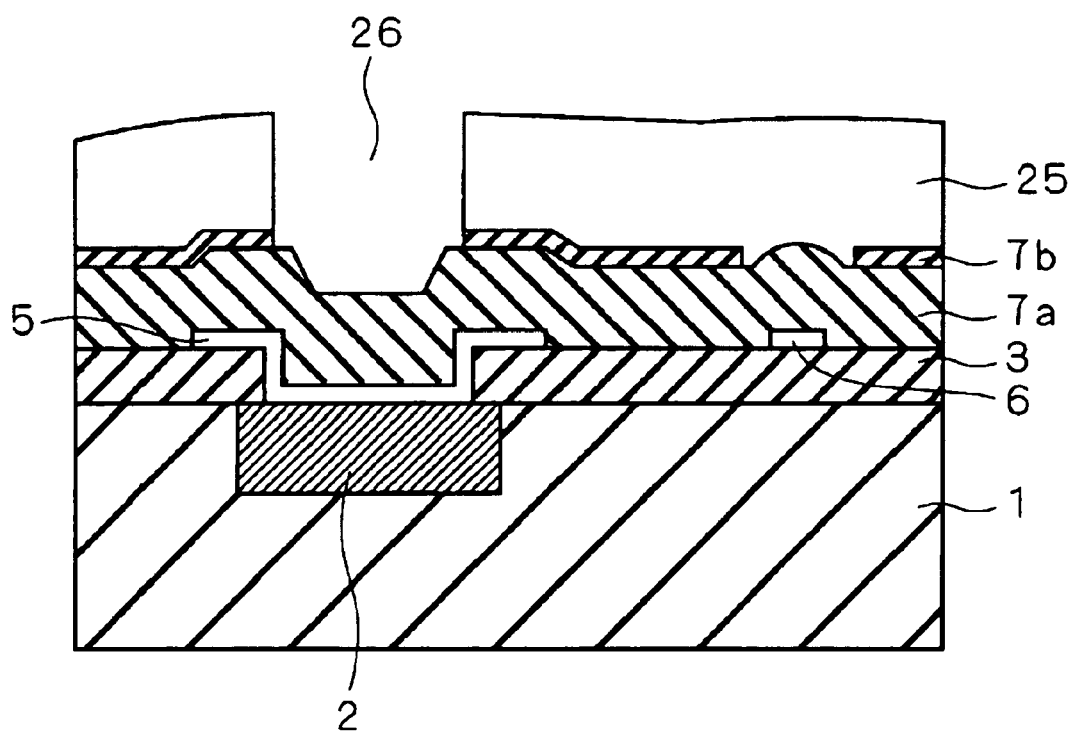

Next, as shown in FIG. 15, a resist 25 is coated to cover the silicon nitride film 7b and silicon oxide film 7a, and exposure and development is performed to form an opening 26 in the surface of the resist 25 above the pad 5. The silicon oxide film 7a is exposed from the bottom surface of the opening 26.

Figure 16:
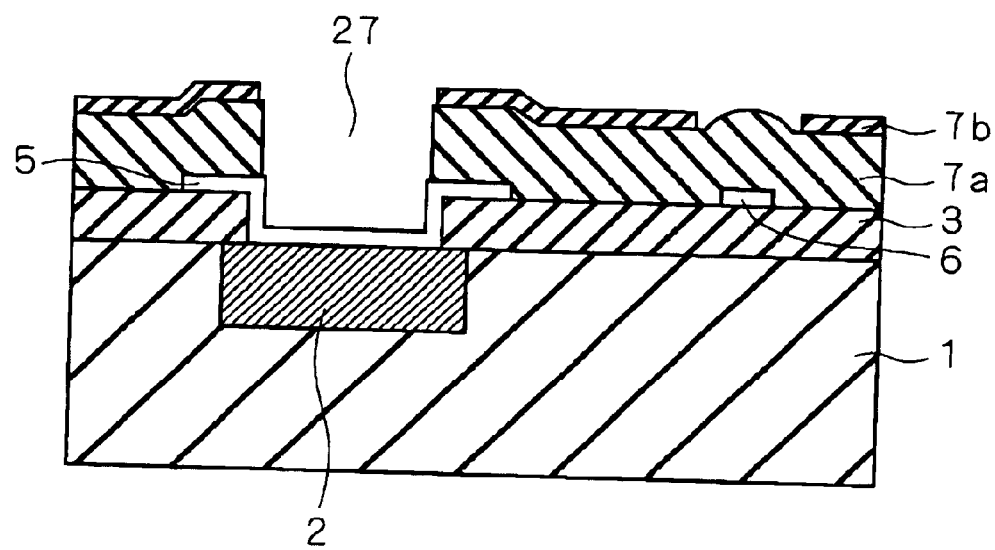

Next, anisotropic etching is performed using the resist 25 as a mask to selectively remove the silicon oxide film 7a, for forming an opening 27. Thereafter, the resist 25 is removed as shown in FIG. 16. As is seen from FIG. 16, the pad 5 is exposed from the bottom surface of the opening 27 with this step.

Figure 17:
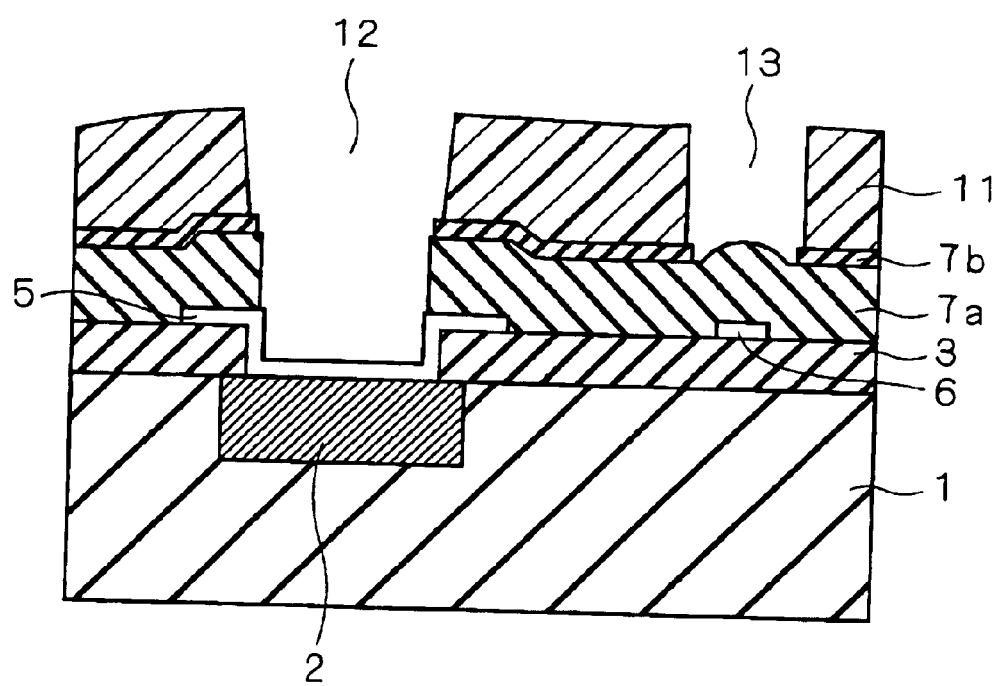

Next, the photosensitive polyimide film 11 is coated to cover the pad 5 and passivation film (7a and 7b), and exposure and development is performed using a mask (not shown) having openings above the pad 5 and fuse 6, respectively, for forming the openings 12 and 13 in the polyimide film 11. The mask is thereafter removed, and the polyimide film 11 is subjected to curing to obtain the structure shown in FIG. 17. As is seen from FIG. 17, the passivation film (7a and 7b) and polyimide film 11 are absent above the pad 5 (where the opening 12 is provided) and only the silicon oxide film 7a is formed over the fuse 6 (where the opening 13 is provided).

Formation of the solder bumps 14 and flip chip mounting of the semiconductor chip 15 and assembly substrate 16 performed thereafter are the same as those in the first preferred embodiment, repeated explanation of which is thus omitted here.

As described, the flip chip mounting method according to the present embodiment, by which the passivation film (7a and 7b) are removed before forming the polyimide film 11, can achieve the same effect as described in the first preferred embodiment.

Third Preferred Embodiment

A third preferred embodiment is also directed to the case of using a two-layered passivation film (in which a nitride film and an oxide film are stacked), however, the passivation film is removed with different steps from those in the second preferred embodiment. A flip chip mounting method according to the present embodiment will specifically be described referring to sectional views showing manufacturing steps.

First, a semiconductor chip having the structure as described in the first preferred embodiment as shown in FIG. 2 is formed, and the silicon nitride film 7b is formed over the silicon oxide film 7a as described in the second preferred embodiment referring to FIG. 12.

Figure 18:
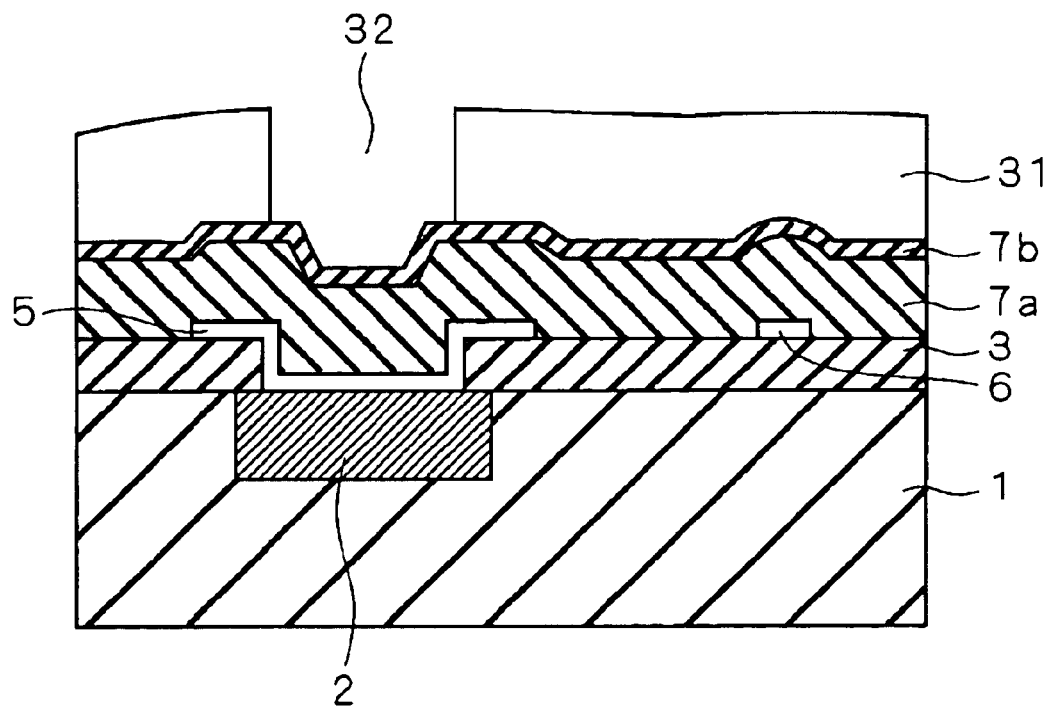
FIGS. 18 through 21 are explanatory sectional views of manufacturing steps of a chip according to a third preferred embodiment of the invention.

Next, as shown in FIG. 18, a resist 31 is coated to cover the silicon nitride film 7b, and exposure and development is performed to form an opening 32 in the surface of the resist 31 above the pad 5. The silicon nitride film 7b is exposed from the bottom surface of the opening 32.

Figure 19:
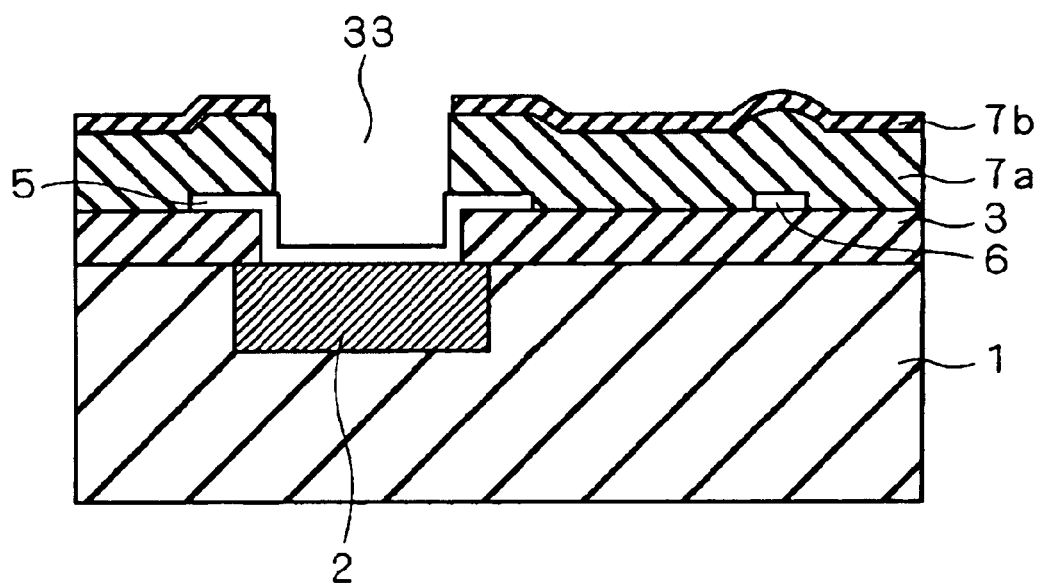

Next, anisotropic etching is performed using the resist 31 as a mask to selectively remove the silicon nitride film 7b and silicon oxide film 7a, for forming an opening 33. Thereafter, the resist 31 is removed as shown in FIG. 19. As is seen from FIG. 19, the pad 5 is exposed from the bottom surface of the opening 33.

Figure 20:
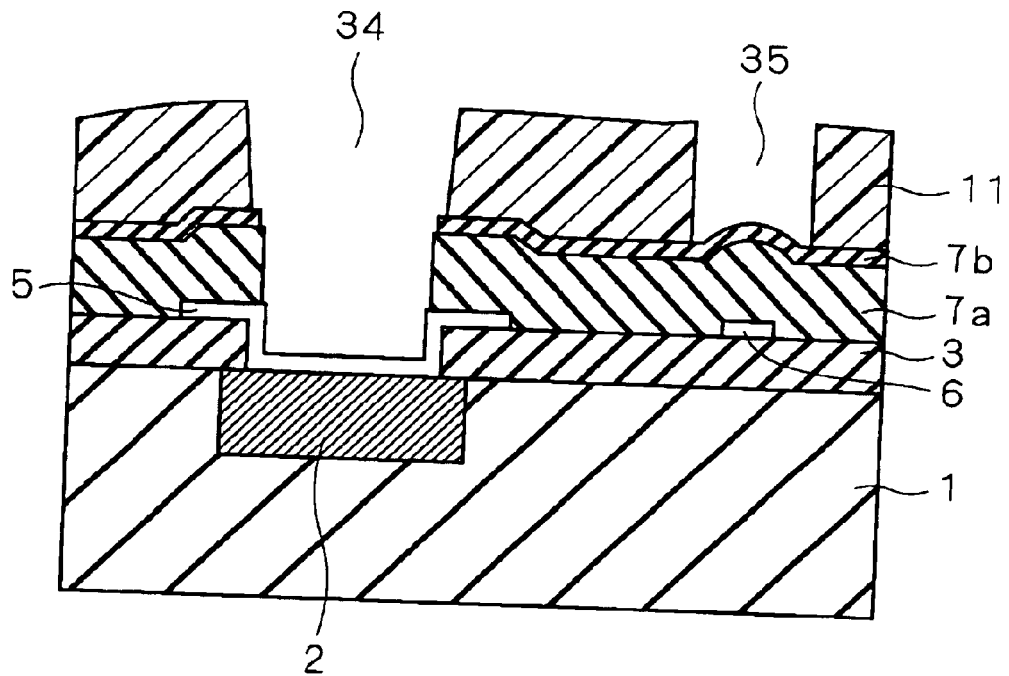

Next, the photosensitive polyimide film 11 is coated to cover the passivation film (7a and 7b) and pad 5, and exposure and development is performed using a mask (not shown) having openings above the pad 5 and fuse 6, respectively, for forming openings 34 and 35 in the polyimide film 11. The mask is thereafter removed, and the polyimide film 11 is subjected to curing to obtain the structure as shown in FIG. 20. As is seen from FIG. 20, the passivation film (7a and 7b) and polyimide film 11 are absent above the pad 5 (where the opening 34 is provided) and only the passivation film (7a and 7b) is formed over the fuse 6 (where the opening 35 is provided).

Figure 21:
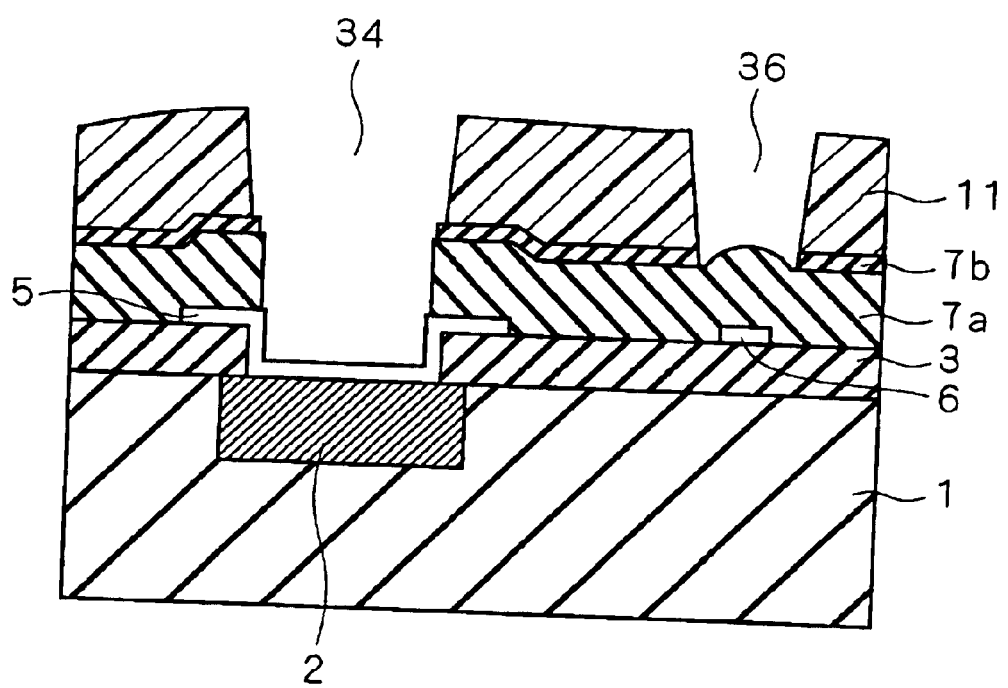

Next, anisotropic etching is performed using the polyimide film 11 as a mask to selectively remove the silicon nitride film 7b, for forming an opening 36 as shown in FIG. 21. As is seen from FIG. 21, the silicon oxide film 7a is exposed from the bottom surface of the opening 36.

Formation of the solder bumps 14 and flip chip mounting of the semiconductor chip 15 and assembly substrate 16 performed thereafter are the same as those in the first preferred embodiment, repeated explanation of which is thus omitted here.

As described, with the flip chip mounting method according to the present embodiment, removal of the silicon nitride film 7b above the fuse 6 using the polyimide film 11 as a mask causes a reaction product of the silicon nitride film 7b to adhere to the surface of the polyimide film 11.

However, since a reaction product of the silicon nitride film 7b have better adhesion to the underfill resin 17 than a reaction product of the silicon oxide film 7a, adhesion between the semiconductor chip 15 and assembly substrate 16 can be promoted in the present embodiment as well (though not better than in the other preferred embodiments).

Further, employing the flip chip mounting method according to the present embodiment (that is, removing the silicon nitride film 7b using the polyimide film 11 as a mask), the number of resists can be reduced by one as compared to the second and fourth preferred embodiments, leading to simplification of the flip chip mounting method, which can cut down manufacturing costs.

Fourth Preferred Embodiment

A fourth preferred embodiment is also directed to the case of using a two-layered passivation film (in which a nitride film and an oxide film are stacked), however, the passivation film is removed by different steps from those in the second and third preferred embodiments. A flip chip mounting method according to the present embodiment will specifically be described referring to sectional views showing manufacturing steps.

First, the semiconductor chip having the structure described in the first preferred embodiment as shown in FIG. 2 is formed, and the silicon nitride film 7b is formed over the silicon oxide film 7a as described in the second preferred embodiment referring to FIG. 12. Thereafter, as described in the second preferred embodiment referring to FIGS. 18 and 19, the passivation film (7a and 7b) above the pad 5 is removed.

Figure 22:
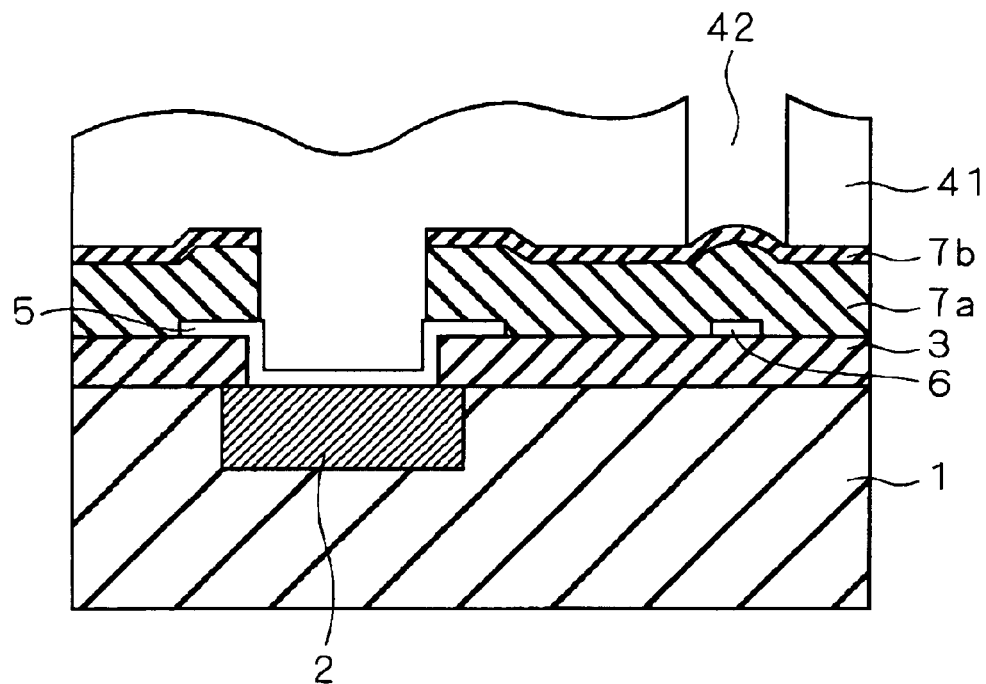
FIGS. 22 through 24 are explanatory sectional views of manufacturing steps of a chip according to a fourth preferred embodiment of the invention.

Next, as shown in FIG. 22, a resist 41 is coated to cover the pad 5 and passivation film (7a and 7b), and exposure and development is performed to form an opening 42 in the surface of the resist 41 above the fuse 6. The silicon nitride film 7b is exposed from the bottom surface of the opening 42.

Figure 23:
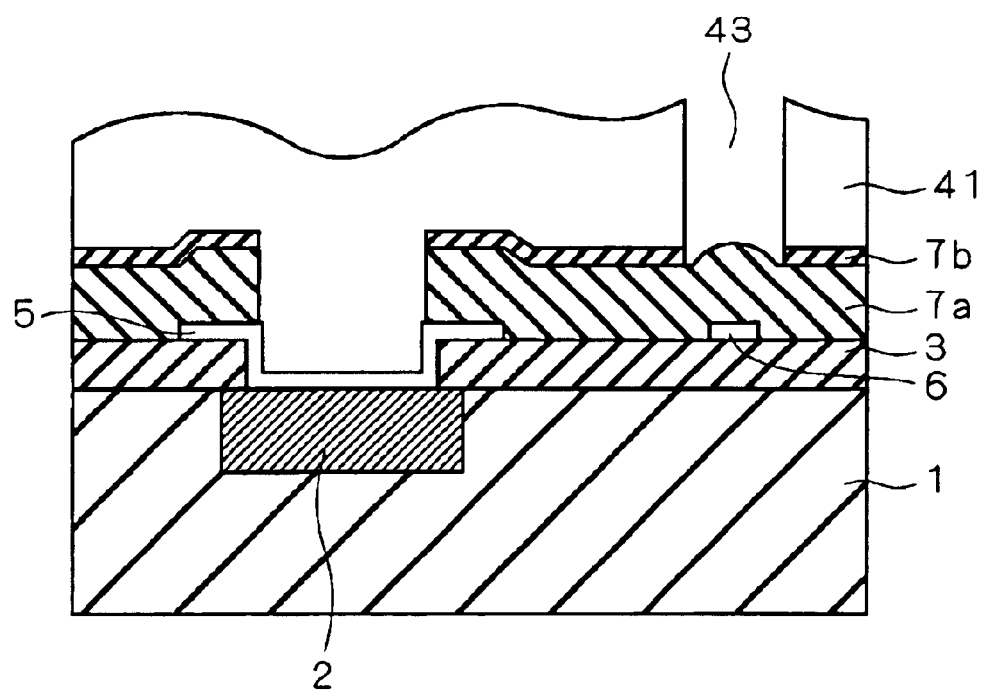

Next, anisotropic etching is performed using the resist 41 as a mask to selectively remove the silicon nitride film 7b, for forming an opening 43 as shown in FIG. 23. As is seen from FIG. 23, the silicon oxide film 7a is exposed from the bottom surface of the opening 43.

Figure 24:
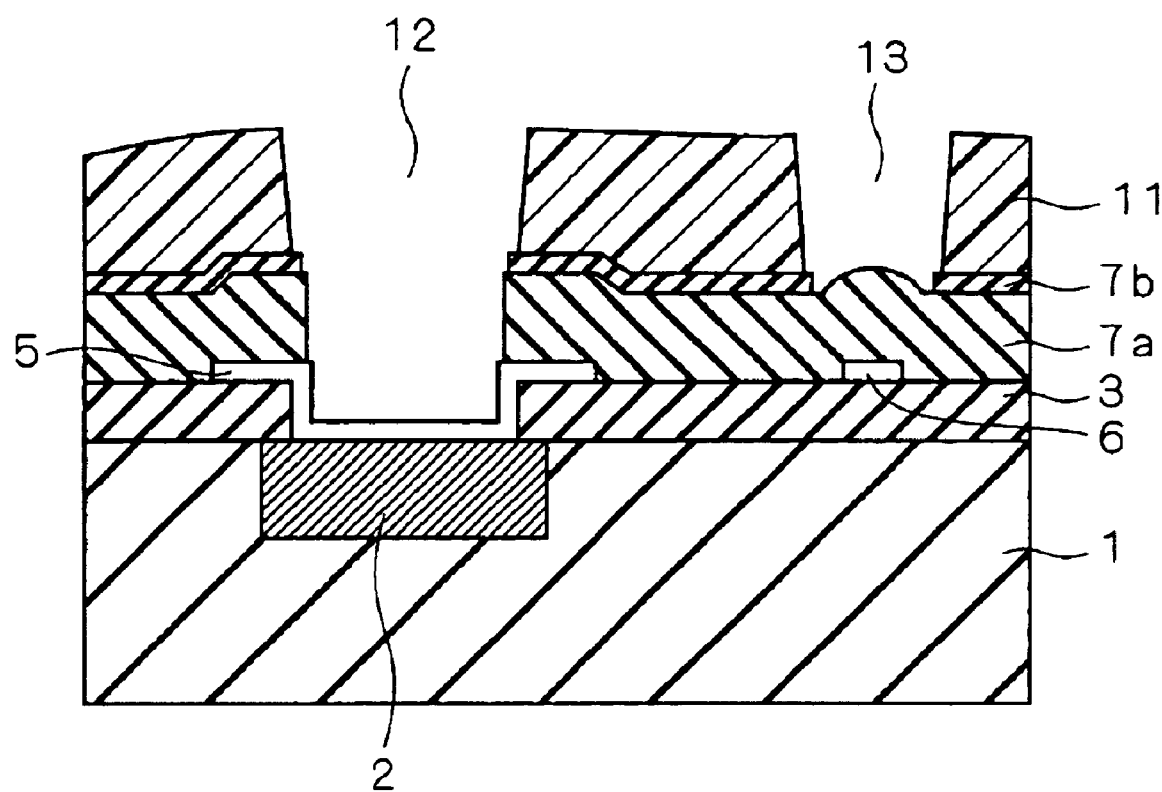

Next, after removing the resist 41, the photosensitive polyimide film 11 is coated to cover the pad 5 and passivation film (7a and 7b), and exposure and development is performed using a mask (not shown) having openings above the pad 5 and fuse 6, respectively, for forming the openings 12 and 13 in the polyimide film 11. The mask is thereafter removed, and the polyimide film 11 is subjected to curing to obtain the structure shown in FIG. 24. As is seen from FIG. 24, the passivation film (7a and 7b) and polyimide film 11 are absent above the pad 5 (where the opening 12 is provided) and only the silicon oxide film 7a is formed over the fuse 6 (where the opening 13 is provided).

Formation of the solder bumps 14 and flip chip mounting of the semiconductor chip 15 and assembly substrate 16 performed thereafter are the same as those in the first preferred embodiment, repeated explanation of which is thus omitted here.

As described, the flip chip mounting method according to the present embodiment, by which the passivation film (7a and 7b) are removed before forming the polyimide film 11, can achieve the same effect as described in the first preferred embodiment.

The present embodiment has been directed to the case of applying the flip chip mounting method of the present invention to the structure in which the pad 5 and fuse 6 are covered with the passivation film 7 (a kind of insulation film).

However, the present invention may also be applied to the structure in which the pad 5 and fuse 6 are covered with a film merely called insulation film, not passivation film. That is, in flip chip mounting, manufacturing steps may be carried out in the order that a certain part of the insulation film is removed before forming the polyimide film 11.

Here, an insulation film, in a broad sense, involves a film called passivation, a kind of insulation film, and an insulation film in a narrow sense (i.e., a film merely called insulation film, not passivation film).

Although the above preferred embodiments have been directed to the semiconductor chip having the fuse 6, the fuse 6 may not necessarily be provided in view of the characteristics of the present invention that part of the passivation film (insulation film) 7 over the pad 5 is removed before forming the polyimide film 11.

However, by applying the flip chip mounting method of the present invention to the semiconductor chip 15 having the fuse 6, adhesion between the semiconductor chip 15 and assembly substrate 16 can be promoted without making fuse blowing difficult in a device having redundancy.

While the invention has been shown and described in detail, the foregoing description is in all aspects illustrative and not restrictive. It is therefore understood that numerous modifications and variations can be devised without departing from the scope of the invention.

What is claimed is:

1. A flip chip mounting method comprising the steps of:
   (a) preparing a chip including a pad covered with an insulation film;
   (b) selectively removing said insulation film over said pad to expose said pad;
   (c) after said step (b), forming a polyimide film including a first opening for exposing said pad, on said insulation film;
   (d) filling said first opening to form a solder bump on said pad; and
   (e) filling an underfill resin between an assembly substrate and said chip, for bonding said assembly substrate and said chip with said solder bump interposed therebetween, wherein
   said chip prepared in said step (a) further includes a fuse covered with said insulation film,
   said step (b) further includes the step of selectively removing said insulation film above said fuse, and
   said polyimide film formed in said step (c) further includes a second opening formed above said fuse.

2. The flip chip mounting method according to claim 1, wherein
   said insulation film is a passivation film in which an oxide film and a nitride film are stacked in this order, and
   step (b) includes the steps of:
   (b-1) selectively removing said nitride film above said pad and selectively removing said nitride film above said fuse; and
   (b-2) after said step (b-1), selectively removing said oxide film above said pad, for exposing said pad.

3. The flip chip mounting method according to claim 1, wherein
   said insulation film is a passivation film in which an oxide film and a nitride film are stacked in this order, and
   said step (b) further includes the steps of:
   (b-3) selectively removing said nitride film and oxide film over said pad, for exposing said pad; and
   (b-4) selectively removing said nitride film above said fuse using a mask which covers said pad as exposed.

4. The flip chip mounting method according to claim 1, wherein
   said step (b) further includes the steps of:
   (b-10) forming a resist including a predetermined opening on said insulation film;
   (b-11) selectively removing said insulation film over said pad and said insulation film above said fuse, for exposing said pad, by etching using said resist as a mask; and
   (b-12) removing said resist after said step (b-11).

* * * * *